United States Patent
Hocevar

(10) Patent No.: US 7,162,684 B2
(45) Date of Patent: Jan. 9, 2007

(54) EFFICIENT ENCODER FOR LOW-DENSITY-PARITY-CHECK CODES

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 10/724,280

(22) Filed: Nov. 28, 2003

(65) Prior Publication Data

US 2004/0148560 A1    Jul. 29, 2004

Related U.S. Application Data

(60) Provisional application No. 60/442,945, filed on Jan. 27, 2003.

(51) Int. Cl.
*G06F 11/00* (2006.01)
*H03M 13/00* (2006.01)

(52) U.S. Cl. .................................................. 714/800
(58) Field of Classification Search ................ 714/800
See application file for complete search history.

(56) References Cited

U.S. PATENT DOCUMENTS

| | | |
|---|---|---|
| 6,539,367 B1 | 3/2003 | Blanksby et al. |
| 6,633,856 B1 | 10/2003 | Richardson et al. |
| 6,718,514 B1* | 4/2004 | Kang .................... 714/800 |
| 6,842,872 B1 | 1/2005 | Yedida et al. |
| 7,058,873 B1* | 6/2006 | Song et al. ................. 714/752 |
| 2003/0043487 A1 | 3/2003 | Morita et al. |
| 2003/0104788 A1 | 6/2003 | Kim |

OTHER PUBLICATIONS

Zhang et al. A class of efficient-encoding generalized low density parity check codes, 2001, IEEE, p. 2477-2480.*
Gallager, *Low-Density Parity-Check Codes*, (MIT Press, 1963).
Mackay et al., "Comparison of Contructions of Irregular Gallager Codes", *Trans. Comm.*, vol. 47, No. 10 (IEEE, Oct. 1999), pp. 1449-1454.
Tanner et al., "A Class of Group-Structured LDPC Codes", *ISTCA-2001 Proc.* (Ambleside, England, 2001).
Richardson et al., "Efficient Endcoding of Low-Density Parity-Check Codes", *IEEE Trans. on Information Theory*, vol. 47, No. 2 (Feb. 2001), pp. 638-656.
Zhang et al., "VLSI Implementation-Oriented (3,k)-Regular Low-Density Parity-Check Codes", IEEE Workshop on Signal Processing Systems (Sep. 2001), pp. 25-36.

* cited by examiner

*Primary Examiner*—Shelly Chase
(74) *Attorney, Agent, or Firm*—J. Dennis Moore; W. James Brady; Frederick J. Telecky, Jr.

(57) ABSTRACT

Encoder circuitry for applying a low-density parity check (LDPC) code to information words is disclosed. The encoder circuitry takes advantage of a macro matrix arrangement of the LDPC parity check matrix in which a left-hand portion of the parity check matrix is arranged as an identity macro matrix, each entry of the macro matrix corresponding to a permutation matrix having zero or more circularly shifted diagonals. The encoder circuitry includes a cyclic multiply unit, which includes a circular shift unit for shifting a portion of the information word according to shift values stored in a shift value memory for the matrix entry, and a bitwise exclusive-OR function for combining the shifted entry with accumulated previous values for that matrix entry. Circuitry for solving parity bits for row rank deficient portions of the parity check matrix is also included in the encoder circuitry.

32 Claims, 7 Drawing Sheets

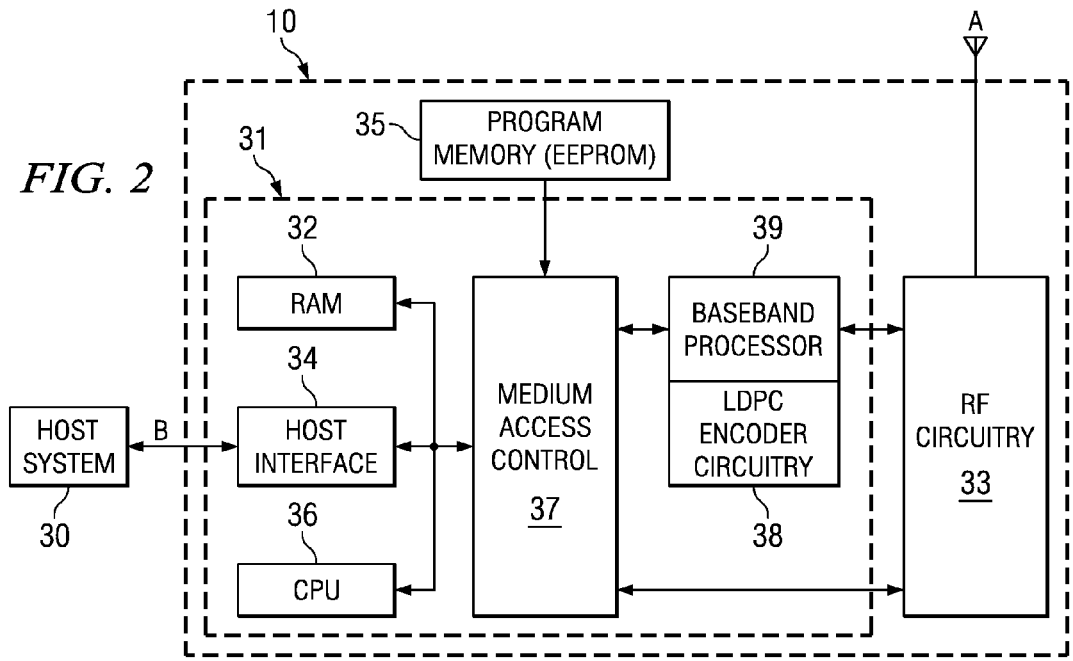

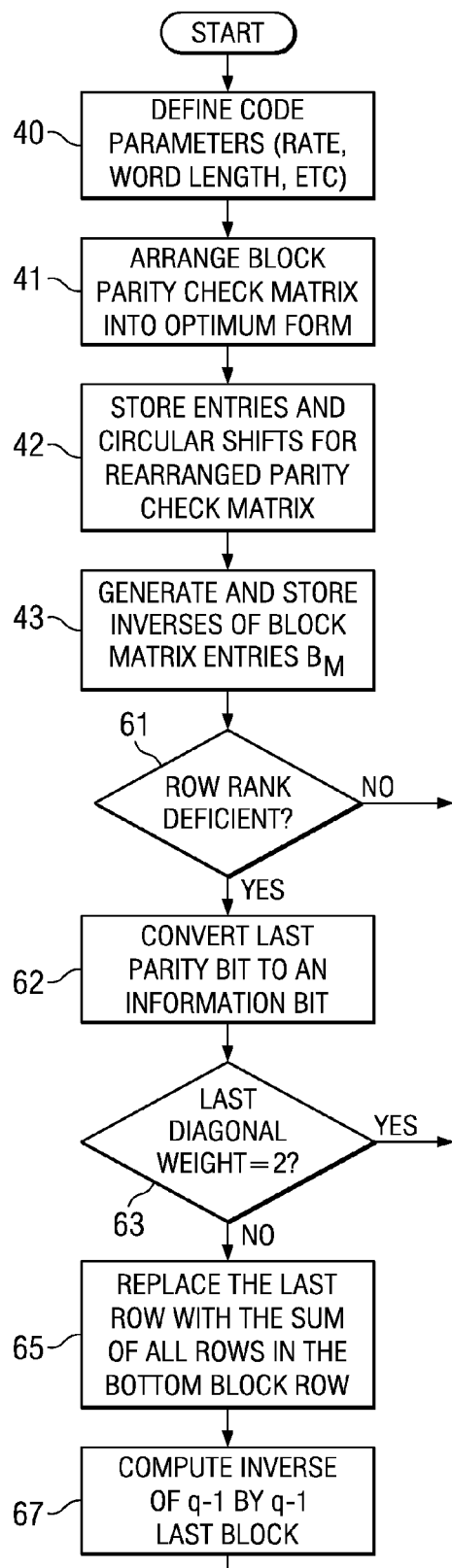
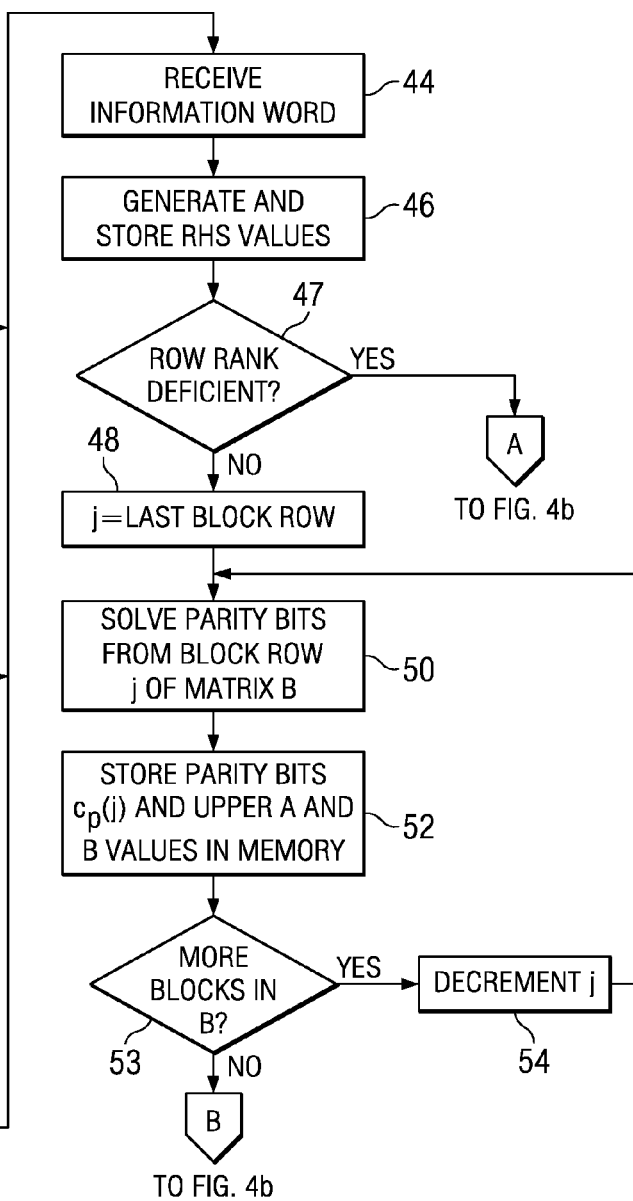
FIG. 4a

EFFICIENT ENCODER FOR LOW-DENSITY-PARITY-CHECK CODES

CROSS-REFERENCE TO RELATED APPLICATIONS

This application claims priority, under 35 U.S.C. §119(e), of Provisional Application No. 60/442,945, filed Jan. 27, 2003.

STATEMENT REGARDING FEDERALLY SPONSORED RESEARCH OR DEVELOPMENT

Not applicable.

BACKGROUND OF THE INVENTION

This invention is in the field of data communications, and is more specifically directed to redundant coding for error detection and correction in such communications.

High-speed data communications, for example in providing high-speed Internet access, is now a widespread utility for many businesses, schools, and homes. In its current stage of development, this access is provided according to an array of technologies. Data communications are carried out over existing telephone lines, with relatively slow data rates provided by voice band modems (e.g., according to the current v.92 communications standards), and higher data rates provided by Digital Subscriber Line (DSL) technology. Another current technology involves the use of cable modems communicating over coaxial cable, often in combination with cable television services. The Integrated Services Digital Network (ISDN) is a system of digital phone connections over which data is transmitted simultaneously across the world using end-to-end digital connectivity. Localized wireless network connectivity according to the IEEE 802.11 standard has become popular for connecting computer workstations and portable computers to a local area network (LAN), and often through the LAN to the Internet. Wireless data communication in the Wide Area Network (WAN) context, which provides cellular-type connectivity for portable and handheld computing devices, is now also becoming a popular technology.

A problem that is common to all data communications technologies is the corruption of data by noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol as received is in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented by the technique of redundant coding. In general, redundant coding inserts data bits into the transmitted data stream that do not add any additional information, but that indicate, on decoding, whether an error is present in the received data stream. More complex codes provide the ability to deduce the true transmitted data from a received data stream even if errors are present.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modern data correction codes have been developed to more closely approach the theoretical limit. An important type of these conventional codes are "turbo" codes, which encode the data stream by applying two convolutional encoders. One of these convolutional encoders encodes the datastream as given, while the other encodes a pseudo-randomly interleaved version of the data stream. The results from the two encoders are interwoven to produce the encoded data stream.

Another class of known redundant codes are the Low Density Parity Check (LDPC) codes. The fundamental paper describing these codes is Gallager, *Low-Density Parity-Check Codes,* (MIT Press, 1963), monograph available at http://www.inference.phy.cam.ac.uk/mackay/gallager/papers/. In these codes, a sparse matrix H defines the code, with the encodings c of the payload data satisfying:

$$Hc=0 \qquad (1)$$

over Galois field GF(2). Each encoding c consists of the source message $c_i$ combined with the corresponding parity check bits $c_p$ for that source message $c_i$. The encodings c are transmitted, with the receiving network element receiving a signal vector r=c+n, n being the noise added by the channel. Because the decoder at the receiver knows matrix H, it can compute a vector z=Hr. However, because r=c+n, and because Hc=0:

$$z=Hr=Hc+Hn=Hn \qquad (2)$$

The decoding process thus involves finding the sparsest vector x that satisfies the equation:

$$Hx=z \qquad (3)$$

over GF(2). The vector x becomes the best guess for noise vector n, which can be subtracted from the received signal vector r to recover encodings c, from which the original source message $c_i$ is recoverable.

There are many known implementations of LDPC codes. Some of these LDPC codes have been described as providing code performance that approaches the Shannon limit, as described in MacKay et al., "Comparison of Constructions of Irregular Gallager Codes", *Trans. Comm.*, Vol. 47, No. 10 (IEEE, October 1999), pp. 1449–54, and in Tanner et al., "A Class of Group-Structured LDPC Codes", *ISTCA*-2001 *Proc.* (Ambleside, England, 2001).

In theory, the encoding of data words according to an LDPC code is straightforward. Given enough memory or small enough data words, one can store all possible code words in a lookup table, and look up the code word in the table according to the data word to be transmitted. But modern data words to be encoded are on the order of 1 kbits and larger, rendering lookup tables prohibitively large. Accordingly, algorithms have been developed that derive codewords, in real time, from the data words to be transmitted. A straightforward approach for generating a codeword is to consider the n-bit codeword vector c in its systematic form, having data or information portion $c_i$ and an m-bit parity portion $c_p$ such that $c=(c_i, c_p)$. Similarly, parity matrix H is placed into a systematic form $H_{sys}$, preferably in a lower triangular form for the m parity bits. In this conventional encoder, the information portion $c_i$ is filled with n-m information bits, and the m parity bits are derived by back-substitution with the systematic parity matrix $H_{sys}$. This approach is described in Richardson and Urbanke, "Efficient Encoding of Low-Density Parity-Check Codes", *IEEE Trans. on Information Theory*, Vol. 47, No. 2 (February 2001), pp. 638–656. This article indicates that, through matrix manipulation, the encoding of LDPC codewords can be accomplished in a number of operations that approaches a linear relationship with the size n of the codewords. However, the computational efficiency in this and other conventional LDPC encoding techniques does not necessarily translate into an efficient encoder hardware architecture. Specifically, these and other conventional encoder architectures are inefficient because the typically involve the storing of inverse matrices, by way of which the parity check equation (1) or a corollary is solved in the encoding operation.

By way of further background, my copending patent application Ser. No. 10/329,597, filed Dec. 26, 2002, commonly assigned herewith, and incorporated herein by this reference, describes a family of structured irregular LDPC codes, and a decoding architecture for those codes. It has been discovered, in connection with this invention, that these structured LDPC codes can also provide efficiencies in the hardware implementation of the encoder.

BRIEF SUMMARY OF THE INVENTION

It is therefore an object of this invention to provide an encoder architecture for encoding large data words according to low-density parity-check (LDPC) codes.

It is a further object of this invention to provide such an architecture that provides flexibility relative to the specific LDPC codes being applied.

Other objects and advantages of this invention will be apparent to those of ordinary skill in the art having reference to the following specification together with its drawings.

The present invention may be implemented into circuitry for applying LDPC encoding to data words for transmission over a communications facility. The encoder includes a memory for storing precalculated values of the parity matrix corresponding to the LDPC code; this precalculation is based on matrix operations that factor the parity matrix into a block matrix having a substantial portion in the form of an identity block matrix, with remaining block entries having reasonably small values. The known information bits of the data word to be encoded are multiplied by matrix entries to derive a set of right-hand side values. The encoder then includes a circular multiplier architecture, by way of which the parity bits are solved by a series of shifts and bitwise exclusive-OR operations, and the results accumulated. This encoder eliminates the need for storage of large inverse matrices, greatly improving the efficiency of the encoder and reducing its cost of implementation.

BRIEF DESCRIPTION OF THE SEVERAL VIEWS OF THE DRAWING

FIG. 2 is an electrical diagram, in block form, of a transceiver constructed according to the preferred embodiments of the invention.

FIGS. 3a through 3c illustrate the operation of pre-implementation calculations in factoring a parity check matrix according to the preferred embodiment of the invention.

DETAILED DESCRIPTION OF THE INVENTION

The present invention will be described in connection with an example of its implementation in an exemplary transceiver, for example a wireless network adapter such as according to the IEEE 802.11 wireless standard. It will be apparent to those skilled in the art having reference to this specification that this invention is particularly well-suited for use in such an application. However, it is also contemplated that this invention will be of similar benefit in many other applications that involve error correction coding, including communications according to orthogonal frequency division multiplexing (OFDM), discrete multitone modulation (DMT) for example as used in conventional Digital Subscriber Line (DSL) modems, and other modulation and communication approaches, whether carried out as land line or wireless communications. It is therefore to be understood that these and other alternatives to and variations on the embodiment described below are contemplated to be within the scope of the invention as claimed.

Figure 1:
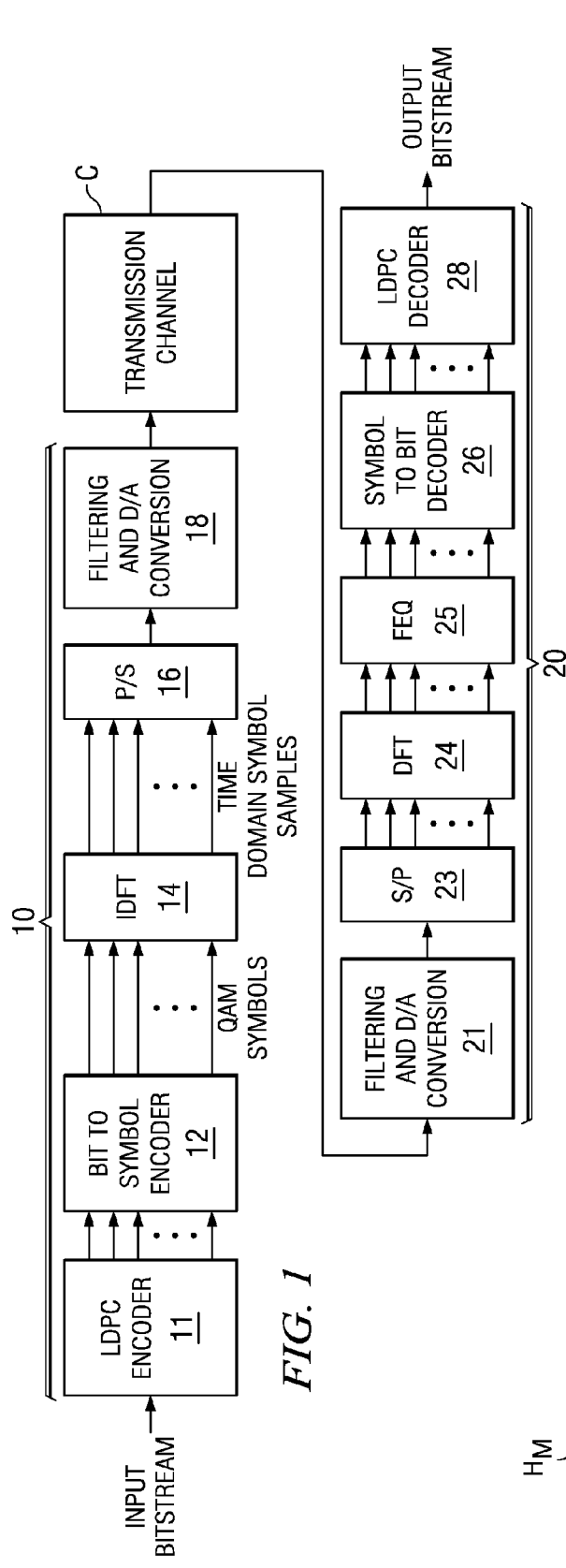
FIG. 1 is a functional block diagram of communications between two OFDM transceivers, where at least the transmitting transceiver is constructed according to a first preferred embodiment of the invention.

FIG. 1 functionally illustrates an example of a somewhat generalized communication system into which the preferred embodiment of the invention is implemented. The illustrated system corresponds to an OFDM modulation arrangement, as useful in OFDM wireless communications as contemplated for IEEE 802.11 wireless networking. The data flow in this approach is also analogous to Discrete Multitone modulation (DMT) as used in conventional DSL communications, as known in the art. It is contemplated that this generalized arrangement is provided by way of context only. In the system of FIG. 1, only one direction of transmission (from transmitting transceiver 10 over transmission channel C to receiving transceiver 20) is illustrated. It will of course be understood by those skilled in the art that data will also be communicated in the opposite direction, in which case transceiver 20 will be the transmitting transceiver and transceiver 10 the receiving transceiver.

As shown in FIG. 1, transmitting transceiver 10 receives an input bitstream that is to be transmitted to receiving transceiver 20. The input bitstream may be generated by a computer at the same location (e.g., the central office) as transmitting transceiver 10, or alternatively and more likely is generated by a computer network, in the Internet sense, that is coupled to transmitting transceiver 10. Typically, this input bitstream is a serial stream of binary digits, in the appropriate format as produced by the data source.

The input bitstream is received by LDPC encoder function 11, according to this embodiment of the invention. LDPC encoder function 11 digitally encodes the input bitstream by applying a redundant code for error detection and correction purposes. According to this embodiment of the invention, the redundant LDPC code applied by encoder function 11 is selected in a manner that facilitates implementation and performance of the corresponding decoder in receiving transceiver 20. The specifics of the code will become apparent from the description of this encoder function, presented below relative to the description of the construction and operation of transmitting transceiver 10 according to the preferred embodiment of the invention. In general, the coded bits include both the payload data bits and also code bits that are selected, based on the payload bits, so that the application of the codeword (payload plus code bits) to the sparse LDPC parity check matrix equals zero for each parity check row. After application of the LDPC code, bit to symbol encoder function 12 groups the incoming bits into symbols having a size, for example, ranging up to as many as fifteen bits. These symbols will modulate the various subchannels in the OFDM broadband transmission.

FIG. 2 illustrates an exemplary construction of transmitting transceiver 10, in the form of a wireless network adapter. Transceiver 10 is coupled to host system 30 by way of a corresponding bus B. Host system 30 corresponds to a personal computer, a laptop computer, or any sort of computing device capable of wireless networking in the context of a wireless LAN; of course, the particulars of host system 30 will vary with the particular application. In the example of FIG. 2, transceiver 10 may correspond to a built-in wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 20. Examples of suitable buses for bus B include PCI, MiniPCI, USB, CardBus, and the like.

Transceiver 10 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 10 over the wireless channel, both via antenna A. The architecture of spread spectrum processor 31 into which this embodiment of the invention can be implemented follows that of the TNETW1100 single-chip WLAN medium access controller (MAC) available from Texas Instruments Incorporated. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 10, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within transceiver 10, in the form of a wireless adapater, are other typical support circuitry and functions that are not shown, but that are useful in connection with the particular operation of transceiver 20.

According to the preferred embodiments of the invention, LDPC encoding is embodied in specific custom architecture hardware associated with baseband processor 39, and shown as LDPC encoder circuitry 38 in FIG. 2. LDPC encoding circuitry 38 is custom circuitry for performing the coding of transmitted and data packets according to the preferred embodiments of the invention. In the transceiver context, this circuitry may also include or be associated with the decoding of received data packets, for example as described in my copending patent application Ser. No. 10/329,597, filed Dec. 26, 2002, commonly assigned herewith, and incorporated herein by this reference. A preferred embodiment of the particular construction of LDPC encoder circuitry 38 according to the preferred embodiment of this invention will be described in further detail below.

Alternatively, it is contemplated baseband processor 39 itself, or other computational devices within transceiver 20, may have sufficient computational capacity and performance to implement the encoding functions described below in software, specifically by executing a sequence of program instructions. It is contemplated that those skilled in the art having reference to this specification will be readily able to construct such a software approach, for those implementations in which the processing resources are capable of timely performing such encoding.

In either case, referring back to FIG. 1, the encoded symbols are then applied to inverse Discrete Fourier Transform (IDFT) function 14. IDFT function 14 associates each input symbol with one subchannel in the transmission frequency band, and generates a corresponding number of time domain symbol samples according to the Fourier transform. These time domain symbol samples are then converted into a serial stream of samples by parallel-to-serial converter 16. Functions 11 through 16 thus convert the input bitstream into a serial sequence of symbol values representative of the sum of a number of modulated subchannel carrier frequencies, the modulation indicative of the various data values, and including the appropriate redundant code bits for error correction. Typically, for an input of N/2 complex symbols, IDFT function 14 outputs a block of N real-valued time domain samples. Those skilled in the art having reference to this specification will readily recognize that each of functions 11 through 16 may be carried out, and preferably actually are carried out, as digital operations executed by a digital signal processor (DSP).

Filtering and conversion function 18 then processes the datastream for transmission. Function 18 applies the appropriate digital filtering operations, such as interpolation to increase sample rate and digital low pass filter for removing image components, for the transmission. The digitally-filtered datastream signal is then converted into the analog domain and the appropriate analog filtering is then applied to the output analog signal, prior to its transmission.

The output of filter and conversion function 18 is then applied to transmission channel C, for forwarding to receiving transceiver 20. The transmission channel C will of course depend upon the type of communications being carried out. In the wireless communications context, the channel will be the particular environment through which the wireless transmission takes place. Alternatively, in the DSL context, the transmission channel is physically realized by conventional twisted-pair wire. In any case, transmission channel C adds significant distortion and noise to the transmitted analog signal, which can be characterized in the form of a channel impulse response.

This transmitted signal is received by receiving transceiver 20, which, in general, reverses the processes of transmitting transceiver 10 to recover the information of the input bitstream. Filtering and conversion function 21 in receiving transceiver 20 processes the signal that is received over transmission channel C. Function 21 applies the appropriate analog filtering, analog-to-digital conversion, and digital filtering to the received signals, again depending upon the technology of the communications. In the DSL context, this filtering can also include the application of a time domain equalizer (TEQ) to effectively shorten the length of the impulse response of the transmission channel C. Serial-to-parallel converter 23 converts the filtered datastream into a number of samples that are applied to Discrete Fourier Transform (DFT) function 24. Because, in this OFDM context, the received signal is a time-domain superposition of the modulated subchannels, DFT function 24 recovers the modulating symbols at each of the subchannel frequencies, reversing the IDFT performed by function 14 in transmitting transceiver 10. DFT function 24 outputs a frequency domain representation of a block of transmitted symbols, multiplied by the frequency-domain response of the effective transmission channel. Recovery function 25 then effectively divides out the frequency-domain response of the effective channel, for example by the application of a frequency domain equalizer (FEQ), to recover an estimate of the modulating symbols. Symbol-to-bit decoder function 26 then demaps the recovered symbols, and applies the resulting bits to LDPC decoder function 28.

LDPC decoder function 28 reverses the encoding that was applied in the transmission of the signal, to recover an output bitstream that corresponds to the input bitstream upon which the transmission was based. This output bitstream is then forwarded to the host workstation or other recipient. According to this preferred embodiment of the invention, a preferred architecture for LDPC decoder function 28 is described in the above-incorporated copending patent application Ser. No. 10/329,597.

LDPC Encoding

The theory of operation of the preferred embodiment of the invention will now be described, following which its implementation into LDPC encoding function 11 in transceiver 10, in the form of LDPC encoder circuitry 38 operating in cooperation with baseband processor 39, will then be described.

By way of nomenclature, the LDPC code is fundamentally contained within an mxj parity check matrix H that satisfies the following equation, when multiplied by the true transmitted code word vector c:

$$H \cdot c = 0 \quad (4)$$

over Galois Field (2). For a single one of the m rows in parity check matrix H, this parity check amounts to:

$$H_1 c_1 + H_2 c_2 + \ldots + H_j c_j = 0 \quad (5a)$$

over GF(2). The example of the parity-check equation (5a) thus logically becomes, for an exemplary row of matrix H having a "1" in its columns 1, 3, 4, and 7:

$$c_1 \oplus c_3 \oplus c_4 \oplus c_7 = 0 \quad (5b)$$

According to conventional techniques, once the coding matrix H is defined, the encoding of a message frame is executed in a straightforward if not brute force manner, using conventional programmable integrated circuits such as digital signal processors and the like. Examples of recent encoding techniques are described in Richardson and Urbanke, "Efficient Encoding of Low-Density Parity-Check Codes", *IEEE Trans. on Information Theory*, Vol. 47, No. 2 (February 2001), pp. 638–656. However, as mentioned above, it has been observed, in connection with this invention, that these conventional techniques do not lend themselves to efficient hardware realization.

By way of shorthand, parity check matrix H can be referred to as having left-hand and right-hand sides:

$$[H_L | H_R] \begin{bmatrix} c_p \\ c_i \end{bmatrix} = 0 \quad (6)$$

where $c_i$ is the information portion of codeword c, and where $c_p$ is the parity portion of codeword c. By decomposing parity check matrix H in this manner, one can consider the result:

$$H_L c_p = H_R c_i \quad (7)$$

from which the parity portion $c_p$ of codeword c can readily be solved for a given information portion $c_i$. In the general case, this solution requires the generation of an inverse matrix, namely the inverse of the left-hand matrix portion $H_L$. As known in the art, the calculations and memory requirements for such an operation, particularly for relatively large codewords as contemplated in modern communications, requires sufficient resources that this brute force approach to solving for parity portion $c_p$ for a given information portion $c_i$ is not efficient, especially in the hardware sense.

But if left-hand matrix portion $H_L$ can be manipulated into a convenient form, the solution of the parity portion $c_p$ of codeword c can be quite simple. For example, if left-hand portion $H_L$ is manipulated into the form of the identity matrix I, parity portion $c_p$ directly equates to the right-hand side matrix product. Other forms of left-hand portion $H_L$ may not be quite as convenient, but may permit a recursive or iterative solution for parity portion $c_p$, given the matrix product on the right-hand side. According to the preferred embodiments of the invention, for a given code, certain pre-implementation operations can be performed to resolve parity check matrix H toward this desirable form, leaving only recursive operations for real time solution upon the receipt of the information portion $c_i$ of a codeword c to be encoded. In addition, as will become apparent from the following description, an encoder architecture is formed that efficiently generates the right-hand side matrix product.

In the LDPC code according to the preferred embodiments of the invention, the parity check matrix H is arranged into a composite of circularly shifted identity matrices, this composite being represented by a macro matrix $H_M$. Each entry in macro matrix $H_M$ represents a circularly shifted identity matrix, and initially takes either a 1 or a 0 value. As will be described below, an entry with a 1 value in macro matrix $H_M$ symbolizes a q×q circularly shifted identity matrix at that position within parity check H, while entries with a 0 value symbolize a q×q zero matrix. In alternative codes, the non-zero-valued entries of macro matrix $H_M$ may represent other types of permutation or cyclic matrices, but it is believed that the encoding in such cases will be more complex than in this example using circularly shifted identity matrices. After manipulation, as will be described below, entries in macro matrix $H_M$ may have values greater than 1, in which case these higher values will represent the number of shifted identity matrices (i.e., circularly shifted diagonals having entries of all "1" value) within the q×q matrix.

According to the preferred embodiment of the invention, the macro parity check matrix $H_M$ is factored into a form that enables an efficient encoder architecture. One such form that has been discovered in connection with this invention is a factored, extended, and systematic, factored macro parity check matrix $H_{Mf}$ of the form:

$$H_{Mf} = \left[ \begin{array}{cc|c} I & A_M \\ 0 & B_M \end{array} \middle| R_M \right] \quad (8)$$

where identity matrix I is made as large as possible, while maintaining the values of the entries in the other matrices $A_M$, $B_M$, $R_M$ reasonable. According to this embodiment of the invention, the value of each macro matrix entry is the number of circularly shifted identity diagonals in the q×q matrix that the entry represents. This factorization of parity check matrix $H_{Mf}$ permits the following relationship, referring to the binary form (i.e., non-macro form) of parity check equation (4):

$$H_f \begin{bmatrix} c_p \\ c_i \end{bmatrix} = \left[ \begin{array}{cc|c} \tilde{I} & A \\ 0 & B \end{array} \middle| R \right] \begin{bmatrix} c_p \\ c_i \end{bmatrix} = 0 \quad (9)$$

In equation (9), matrix $\tilde{I}$ is the binary representation of a block identity matrix, within which each diagonal block entry is a circularly shifted identity q×q matrix. In this case, referring to equation (6), the left-hand and right-hand matrix portions of parity check matrix $H_f$ correspond to:

$$\begin{bmatrix} \tilde{I} & A \\ 0 & B \end{bmatrix} = H_L \quad (10a)$$

and $$R = H_R \quad (10b)$$

Referring back to the macro representation of equation (8), submatrix $B_M$ is ideally a p by p diagonal macro matrix, with each entry on the diagonal being a small odd integer. If this ideal situation cannot be attained, a second best goal is to reduce submatrix $B_M$ to an upper triangular matrix in which the diagonal entries are small odd integers. If this second choice cannot be attained, parity check matrix H has a row rank deficiency, which can also be addressed in solving for parity portion $c_p$ of codeword c. As will be described in further detail below, the factorization of parity check matrix H, or its macro matrix $H_M$, into this form is preferably accomplished by way of such conventional matrix operations as column swapping and block row reduction.

Assuming no row rank deficiency, one could completely convert the left side matrix portion $H_L$ to an identity matrix, so that no submatrices A, B are present. However, this could cause the weights in right-side matrix portion R to become very large in many instances, resulting in coding inefficiencies from the cumbersome multiplications of right-side matrix portion R by the information bits $c_i$. It is contemplated that encoding efficiency will be maximized, for most codes, by having some reasonably sized submatrices A, B resulting from the factorization.

Figure 3A:
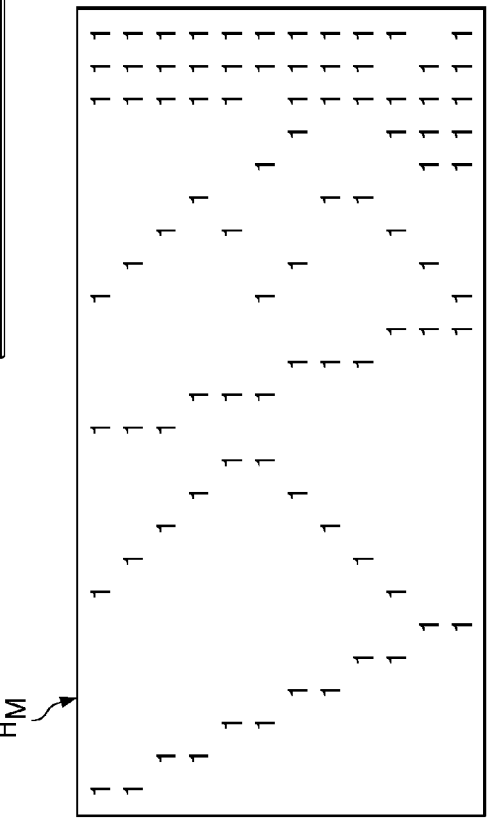

Referring now to FIGS. 3a through 3c, examples of this manipulation of macro parity check matrix $H_M$ will now be described. FIG. 3a illustrates a original form of macro parity check matrix $H_M$, in which each "1" entry, as described above, corresponds to a circularly shifted q×q identity matrix, which is a type of permutation matrix; each blank entry in FIGS. 3a through 3c corresponds to a blank q×q matrix (i.e., a "0" entry, with the 0's not shown in FIG. 3a for clarity). This example of macro parity check matrix $H_M$ corresponds to a rate ½ code (i.e., in which the information portion $c_i$ and parity portion $c_p$ are of the same length). All entries of macro parity check matrix $H_M$ have either "1" or "0" values, indicating that the corresponding q×q matrices at those locations either a circularly shifted identity matrix or blank, respectively. Considering that the goal is to rearrange macro parity check matrix $H_M$ to have as large an identity portion in its upper-left-hand location as possible, reordering of columns and reordering of rows is performed. In this embodiment of the invention, considering that macro parity check matrix $H_M$ represents a parity check matrix H, and that the assignment of information and parity bits within the codeword is somewhat arbitrary, columns and rows of macro parity check matrix $H_M$ can be placed in any order. In doing so, it is preferred that a diagonal be formed from the upper-left hand corner of macro parity check matrix $H_M$, with no "1" entries above the diagonal entries. FIG. 3b shows the result of column and row reordering of macro parity check matrix $H_M$, resulting in macro parity check matrix $H_M'$ as shown in FIG. 3b.

After column and row reordering, the extra "1" entries below the diagonal can be cancelled using conventional row reduction techniques. According to conventional linear algebra techniques, matrix rows can be formed from the linear combination of other rows, making the summed rows redundant. In the sparse macro parity check matrix $H_M$, the sum of a non-zero block matrix position (column) with a zero block matrix position is simply the non-zero value. The sum of two block matrix positions with "1" entries, such that each position represents a circularly shifted identity q×q matrix, is a q×q matrix with two circularly shifted identity diagonals (provided that the shifts are not identical for the two matrices, in which case the sum is a zero matrix). For purposes of this description, such an entry will be referred to as a cyclic submatrix of weight 2, because all columns and rows in that q×q submatrix have a weight of 2. This can be stored in memory as a "2" value, with the actual shift positions of the two diagonals also stored as auxiliary information associated with this matrix position.

Rows can be reduced according to this approach because of the modulo-2 summing of "1" entries along columns where aligned. Considering that rows may be shifted without affecting the result, this also means that the position of the diagonal within the circularly shifted identity matrix for a given block, or submatrix, can also be shifted. Accordingly, a "1" position in macro parity check matrix $H_M{'}$ below the diagonal can be eliminated by cyclically shifting the rows in the corresponding block row to align with the shift of the "1" position in the diagonal, summing the two block rows, and replacing the target block row (i.e., the row below the diagonal) with the sum. For block matrix $H_M$, this sum will include a "0" in the previous "1" position below the diagonal, but may also include block positions with higher weight as described above. These higher weight block column positions are preferably combined toward the right-hand side of the macro parity check matrix.

This row reduction process can be extended further, if desired, in the case where a diagonal entry has an odd weight greater than 1, and entries below the diagonal are to be canceled. In this event, the inverse of the diagonal submatrix itself can be computed, and stored in memory as a description of the submatrix; this inverse can then multiply its block row, resulting in the identity matrix in its left-most non-zero entry (i.e., the entry on the diagonal). Non-zero positions below the diagonal can then be canceled as described above. In addition, the processes of column and row reordering, and additional row reduction operations, can be repeated until the desired factorization is achieved.

Accordingly, this column and row reordering and row replacement process continues, preferably resulting in the ideal situation in which the submatrix $B_M$ is a p by p diagonal matrix, with each entry on the diagonal being a small odd integer. As mentioned above, a next-best goal is to reduce submatrix $B_M$ to an upper triangular matrix in which the diagonal entries are small odd integers. If this also cannot be attained, parity check matrix H has a row rank deficiency, which can also be addressed in solving for parity portion $c_p$ of codeword c according to the preferred embodiment of the invention.

The result of the column reordering and row replacement operation, in factoring parity check matrix H toward its most ideal form, is illustrated by way of example in FIG. 3c. In this example, canceled "1" values in the block parity check matrix $H_{Mf}$ are indicated by an "X"; these values are "0", but are illustrated to show that these positions previously were non-zero. As shown in FIG. 3c, the upper-left-hand portion of the result is matrix I, which is an identity matrix. A blank, or 0, matrix underlies identity matrix I. Matrix $B_M$ is an upper-triangular p by p matrix, with relatively small odd integers on the diagonal (i.e., the next-best case mentioned above). Matrix $A_M$ is above matrix $B_M$, and is a relatively sparse matrix with low weight entries. Matrix $R_M$ contains entries with larger, but still somewhat reasonable, weights.

Upon this rearrangement and factoring of macro matrix $H_{Mf}$ as shown in FIGS. 3a through 3c, the corresponding parity check matrix $H_f$ is in a form according to equation (9). Assuming that submatrix B exists, parity portion $c_p$ corresponds to the portion of codeword c that is multiplied by left-hand matrix $H_{f,L}$, with p×q bits of parity portion $c_p$ corresponding to those columns that are covered by matrices A, B. Accordingly, by inverting submatrix B, these p×q parity bits can be readily solved, because the remaining parity bits in those rows are multiplied by zero. The other bits of parity portion $c_p$ can be easily derived from the application of identity matrix I in left-hand matrix $H_{f,L}$.

Figure 4B:
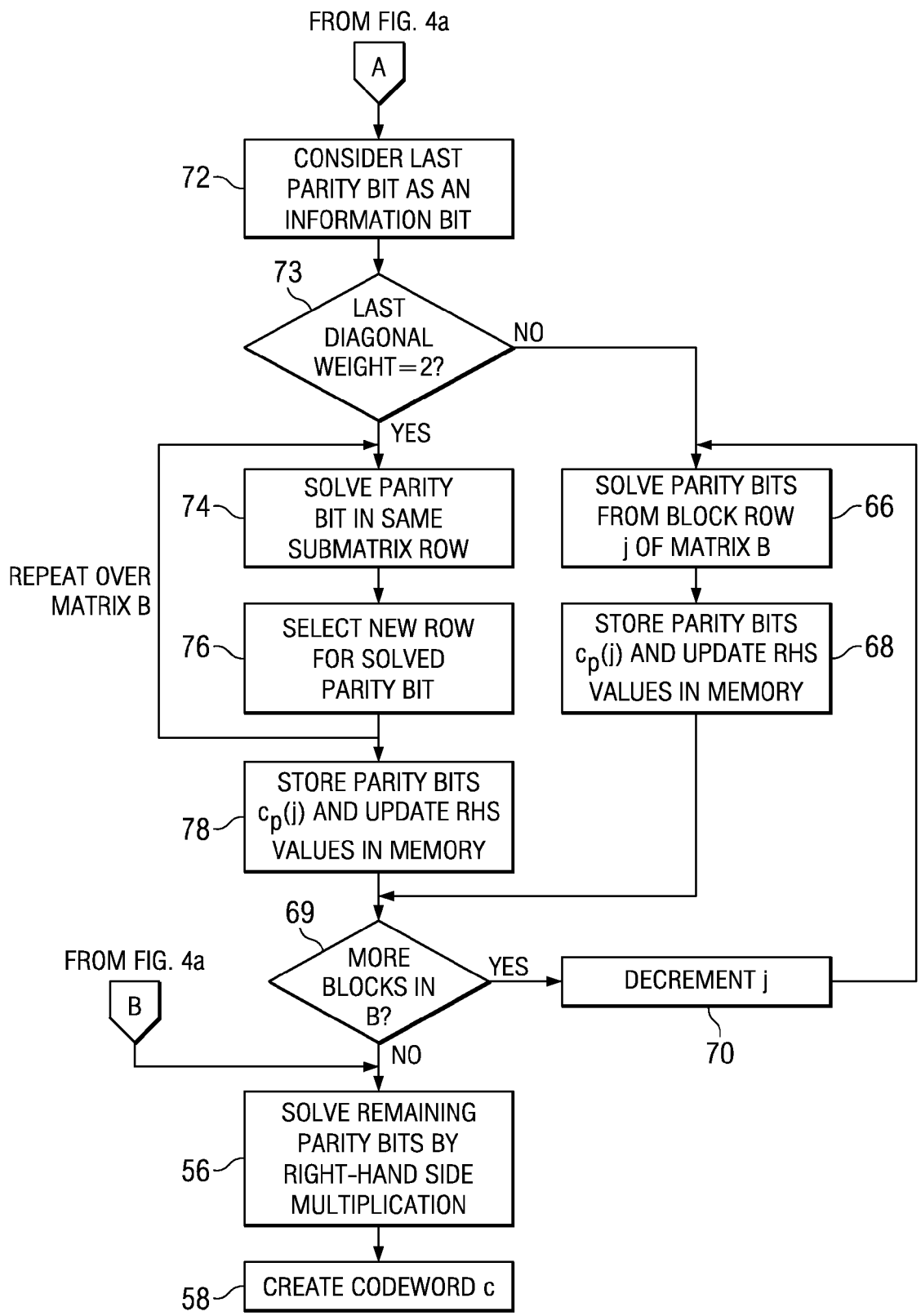
FIG. 4 is a flow chart illustrating the LDPC encoding operation according to the preferred embodiment of the invention

For purposes of constructing this encoder in hardware, these operations in re-arranging parity check matrix H into factored parity check matrix $H_f$ are performed prior to implementation of the code. In the overall encoding process according to the preferred embodiment of the invention, as illustrated in FIG. 4, these pre-implementation processes begin with process 40, in which the parameters of the LDPC code are defined; these parameters include the code rate, codeword length. In process 41, the parity check matrix H and its corresponding macro parity check matrix $H_M$ are defined (for example by way of a pseudo-random process, constrained by the parameters defined in process 40 and other parameters), and rearranged by way of column and row reordering and row replacement (or reduction), as described above, to generate factored macro matrix $H_{Mf}$ in its optimum form according to equation (8). In process 42, the results of these pre-implementation processes are stored, in memory, as the block row and column positions of non-zero entries in parity check matrix $H_f$, the weight of each of these positions, and the shift values for each of the identity diagonals in each position. These parameters can be efficiently stored in a reasonable amount of memory, considering the low-density of parity check matrix H.

As mentioned above, in some cases parity check matrix H has a row rank deficiency. In this case, matrix $B_M$ typically cannot be placed in the form of an upper triangular matrix in which the diagonal entries are small odd integers. Specifically, one or more diagonal entries in matrix $B_M$ will have an even value. In this situation, it is desirable that the reduction process force this even-valued weight to one entry, preferably with as low a weight as possible, and to place this value in the lower-right hand corner of matrix $B_M$, permitting the row rank deficiency to be handled during the actual encoding process according to the preferred embodiment of the invention, as will be described below. Certain preimplementation calculations are necessary in this case, however, beginning with decision 61, which determines whether row rank deficiency is present. In the event that a row rank deficiency exists (decision 61 is YES), an inverse to at least part of matrix B does not exist. In this case, parity check matrix $H_f$ is preferably rearranged so that the last block (last block row, last block column) in matrix B is of even weight, with all other block entries having odd weight. It is contemplated that this arrangement will be possible for nearly all codes within this class.

In process 62, the last (right-most) column in matrices A, B is converted from corresponding to a parity bit to corresponding an information bit, in this row rank deficient case. As such, the incoming information portion $c_i$ will have an additional bit, while the parity portion $c_p$ will be encoded with one fewer bit. This changes the code rate slightly (extremely slightly, for code words on the order of 2000 bits and up), but permits the solution of the matrix equations necessary for encoding. Decision 63 is next determined, to decide whether the weight of the last diagonal block in matrix B is two, in which case (decision 63 is YES) special weight-two solution circuitry (described below) can be used to rapidly derive the code bits without requiring the storing of inverse matrix values. If the weight is greater than two (decision 63 is NO), then an inverse of a portion of matrix $B_M$ must be determined and stored.

According to this preferred embodiment of the invention, the row of parity check matrix H that formerly defined the parity bit (according to the diagonal or upper triangular definition of the left-hand side matrix) is eliminated by process 65. In this process, the last q rows of the entire matrix B (corresponding to the last row in matrix B) are effectively summed together, as a linear combination, and the last row of the matrix is replaced with this sum, in the manner of a row replacement operation. But this last row, specifically the sum of these q rows, consists of all "0" entries, and can now be ignored; the remaining rows in matrix B remain in their previous form. The zeroing of the bottom row in process 65 permits the encoding process to continue in a modified form, as will be described below. Further, the remaining non-zero portion of the last block in matrix B now has q−1 rows and q−1 columns, and now can be inverted since the row rank deficiency has been eliminated by the conversion of a parity bit to an information bit in process 62. In process 67, this inverse of the last submatrix $B_j$ is computed, and stored in memory. It is contemplated that the size of this inverse matrix will typically be on the order of 300 by 300, and as such can be reasonably stored in memory according to modem technology.

On the other hand, if decision 61 returns a NO result, there is no row rank deficiency. In this event, as well as following a NO result in decision 61 or a YES result in decision 63, or the completion of process 67, control passes to process 43. In process 43, inverse matrix values for one or more block entries in submatrix B are derived as necessary for the encoding process, considering that the inverse of a cyclic matrix is itself a cyclic matrix, and these inverse values are stored in memory.

Once macro parity check matrix $H_M$ is rearranged into the desired form indicated by equation (10), and the attributes stored in memory as described above, the pre-implementation processes necessary in preparation for actual encoding of data are complete, and the encoding of an actual data word can be performed. The theory of operation of this encoding process will now be described, beginning with process 44 in FIG. 4. Following this description, the encoder architecture according to this invention that is particularly well-suited to executing this encoding in an efficient manner will then be described. In process 44, LDPC encoder circuitry 39 receives the information portion $c_i$ for which an encoded codeword c is to be produced. In this preferred embodiment of the invention, the LDPC is a systematic code, and as such the resulting codeword c includes the information portion $c_i$ itself, with a parity portion $c_p$ appended (or prepended, as the case may be) thereto. In process 46, the right-hand side matrix $R=H_{f,R}$ is multiplied by this information portion $c_i$, and these product values are stored in memory.

As mentioned above, the presence of a row rank deficiency in parity check matrix $H_f$ as factored, is handled in the encoding of actual data itself. This results in different operations being performed to resolve the first few parity bits, and as such, the encoding process according to the preferred embodiment of the invention begins with decision 47, which determines whether row rank deficiency is present in the code (as previously detected in decision 61). If there is no row rank deficiency, encoding begins in process 48, in which a block row index j is set to the bottom-most block row of matrix B.

Figure 5:
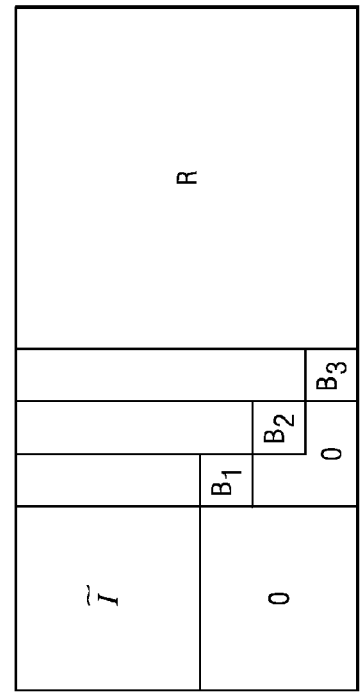
FIG. 5 is a diagram of a rearranged block parity check matrix arranged according to the preferred embodiment of the invention.

FIG. 5 illustrates an example of parity check matrix $H_f$ as rearranged, in which matrix B is represented by three block entries, or submatrices, $B_1$, $B_2$, $B_3$. The columns above submatrices $B_1$, $B_2$, $B_3$ represent matrix A, and the remaining entries of matrix B (which is either diagonal, in the best case, or upper triangular, in the next-best case, as mentioned above). Accordingly, the initialization of index j in process 48, in this example, points to block entry $B_3$, which, as mentioned above, is a q by q matrix containing one or more circularly shifted diagonals.

In process 50, the parity bits associated with the columns of submatrix B are solved, for the particular information portion $c_i$ received in process 46. This solution process 48 is based on equation (7):

$$H_{f,L}c_p = H_{f,R}c_i \qquad (7)$$

which, for block row j or matrix $B_j$, and where $R_j$ is the portion of right-hand side matrix R in block row j reduces to:

$$B_j c_p(j) = R_j c_i \qquad (11)$$

because all entries in block matrix $H_{f,L}$ in the same block row as matrix $B_j$ are zero. In process 50, the inverse of block $B_j$ that was determined in process 43 is multiplied by the right-hand side matrix product of the block row of right-hand side matrix R and information portion $c_i$:

$$c_p(j) = B_j^{-1} R_j c_i \qquad (12)$$

to solve for the parity portion $c_p(j)$, which is the portion of parity word $c_p$ that resides within the $j^{th}$ block column (i.e., in the block column in which block $B_j$ resides). Once parity portion $c_p(j)$ is solved, these values can then be multiplied within block column j above block $B_j$ and accumulated into the right-hand-side values previously stored in process 46

Referring back to FIG. 4, for the example of FIG. 5, in the first instance of process 50, parity portion $c_p(3)$ is solved, and the right-hand side values are updated to now include the columns of matrices A, B that reside in block column j=3. These solved values are stored in memory, in process 52. Decision 53 determines whether additional blocks of matrix B remain to be solved, and if so (decision 53 is YES), index j is decremented in process 54, and solution process 50 is repeated for the next submatrix $B_2$, in this example. This process continues until the parity bits $c_p$ associated with all columns within matrix B have been solved (decision 53 is NO).

At this point, only those parity bits in the columns of block identity matrix $\tilde{I}$ remain to be solved. But because the left-hand side of equation (7) involves only an identity matrix (circularly shifted within each block, or submatrix), these values are determined directly from the previously stored right-hand side values by way of a single cyclical shift of each block row, with no inverse matrix operations necessary. Accordingly, these remaining values of parity portion $c_p$ are solved in process 56, completing the generation of parity portion $c_p$. The full code word c is then generated, by retrieving the solved parity bits $c_p$ from memory, and appending parity portion $c_p$ to information $c_i$. Codeword c is now ready for modulation and transmission.

In the event that a row rank deficiency exists (decision 47 is YES), an inverse to at least part of matrix B does not exist. Accordingly, the solution process used in the non-row-rank deficient case cannot directly be applied. According to the preferred embodiment of the invention, alternative approaches to resolving this situation are provided. In either alternative, as described above, parity check matrix $H_r$ was preferably rearranged so that the last block (last block row, last block column) in matrix B is of even weight, with all other block entries having odd weight. It is contemplated that this arrangement will be possible for nearly all codes within this class.

In process 72, the last parity bit is considered as an information bit, corresponding to the effect of pre-implementation process 62 described above. Decision 73 is next performed to recall whether the weight in the last block of matrix B is two. If so (decision 73 is YES), a streamlined approach to the solution of the parity portion $c_p$ is available, as will be described below. The general case (decision 73 is NO) will first be described, beginning with process 66, which uses the inverse of the last submatrix $B_j$ stored in process 67. This inverse permits the solution of parity portion $c_p(j)$, in process 66. As before, this solution is obtained by multiplying this inverse matrix by the right-hand side matrix product of the block row of right-hand side matrix R and information portion $c_i$, as in equation (12) above, to solve for the parity portion $c_p(j)$, and update the right-hand side values for the columns within block column j within block $B_j$. These values are then stored in memory, in process 68.

Because the even weights were isolated in the last submatrix $B_j$, the remainder of the parity portion $c_p$ can be solved as in the previous case. Accordingly, decision 69 determines if additional diagonal block entries of matrix B remain, and if so (decision 69 is YES), index j is decremented in process 70, and solution and storing processes 66, 68 are repeated for this next block column. This process continues until the parity bits for each column in the entirety of matrix B have been resolved (decision 69 is NO). The encoding process is then completed by solving for the remainder of the parity bits in process 56, and the generation of codeword c in process 58.

The conversion of a parity bit to an information bit in the row-rank-deficient case described above is suitable for any weight value, including a weight of two. However, it has been discovered, in connection with this invention, that additional efficiency can be attained if the last submatrix $B_j$ has an even-valued weight of two. More specifically, the solution of the parity bits can be executed without requiring the storage of an entire inverse submatrix.

In this case, decision 73 indicates that the last submatrix $B_j$ in the row rank deficient parity check matrix has a weight of two (decision 73 is YES). As before, the incoming information portion $c_i$ will have an additional bit, while the parity portion $c_p$ will be encoded with one fewer bit, slightly changing the code rate but permitting the solution of the matrix equations necessary for encoding. Because its weight is only two, submatrix $B_j$ corresponds to a system of equations in which each equation has only two unknowns; the converting of one column to an information bit thus permits the solution of one of these equations. But with one equation in the system solved, this in turn permits the solution of another equation in the system of submatrix $B_j$. The interconnection of these equations in the system of submatrix $B_j$ is used to advantage in this weight-two case, as will now be described relative to FIG. 6.

Figure 6:
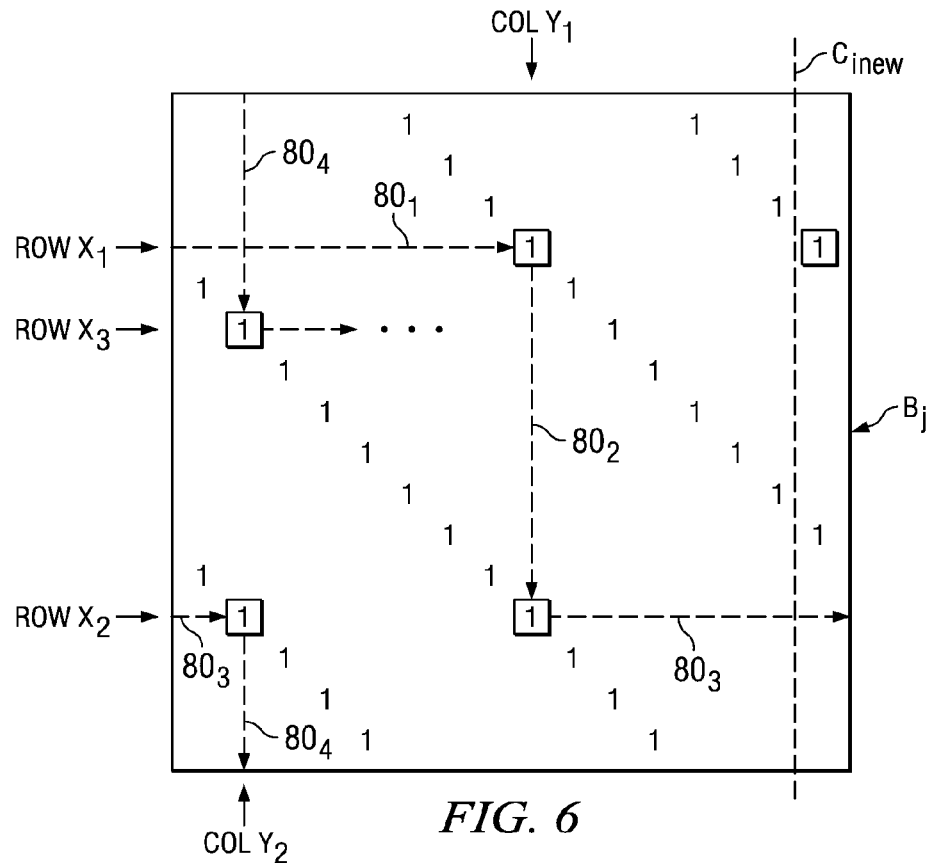
FIG. 6 is a diagram of a submatrix illustrating a method of solving parity bits for a weight-two row rank deficient submatrix, according to the preferred embodiment of the invention.

FIG. 6 illustrates an example of submatrix $B_j$ with weight two (as determined by decision 73). As shown in FIG. 6, each row and each column of submatrix $B_j$ has two entries with "1" values, and all other entries with "0" values (which are left blank in FIG. 6, for clarity). Following process 72, the right-most column q−1 (the first column being column 0) of submatrix $B_j$ is now assigned to an information bit $c_{i_{new}}$, and because it has a weight of two, this column q−1 has two non-zero entries, which reside in different rows of submatrix $B_j$ and thus correspond to two equations. In process 74, one of these equations is selected (either will do); referring to FIG. 6, this equation resides in row x1, and is associated with right-hand-side value $b_{x1}$. Because this input bit is now defined, the other parity bit in row x1 (specifically the parity bit for column y1 as shown in FIG. 6) can now be solved (following path $80_1$ of FIG. 6), and is solved in process 74. This other parity bit in the same row can be found by adding a shift value s (modulo q, where q is the number of columns in submatrix $B_j$) to the column index associated with the known bit; for this first instance, in which the known bit is in column q−1, the other parity bit in the same row is in column s−1, derived by adding the shift value s to the column position q−1, modulo q. The solution of the parity bit for column y1 can now be used to select the equation of row x2 (path $80_2$) as the other row having a non-zero entry in that column, which is performed in process 76. Because submatrix $B_j$ is square, shifting from row x1 to row x2 is also accomplished by adding the shift value s to row index x1, modulo q. This solution then permits the solution of the parity bit for column y2 (path $80_3$), in the next instance of process 74. Process 76 is then performed to select the equation of row x3 (path $80_4$). Processes 74, 76 are repeated, in this manner, until the parity bits associated with submatrix $B_j$ are all resolved. These parity bits are stored in memory, as are updated right-hand-side values for the columns within block column j. These values are then stored in memory, in process 78.

This iterative solution of the parity bits in submatrix $B_j$ in processes 74, 76 can be explained by way of a set of pseudo-instructions. Considering column index y as initialized to the right-most column q−1, a row index x as initialized to the row x1 in the selection of one of the two equations, shift value s as the shift difference between the two circularly shifted diagonals in submatrix $B_j$, $b_x$ as the present right-hand-side value for row x within the last block row, and a given bit value $c_y$ (for the initial case, $c_y$ is the new information bit $c_{i_{new}}$), the following set of operations will result in the solution of the parity bits for submatrix $B_j$:

| | |
|---|---|
| yold = y | saves current value of column index y |
| y = y + s, mod q | adds shift s to select the next column, in the current row, having the other non-zero entry |
| $c_y = b_x + c_{yold}$, mod 2 | solves for parity bit in next column y |
| x = x + s, mod q | selects the next row (process 76) |

The modulo 2 addition used to solve for the next parity bit $c_y$ is simply an exclusive-OR of these two values. This sequence of operations continues for q−1 iterations, to solve for each of the q−1 parity bits of submatrix $B_j$ (one parity bit having been converted to an information bit, in process 72). The right-hand-side values can be updated as before, and the parity bits and updated right-hand-side values stored in memory, in process 78.

Upon completion of these iterations, control passes to decision 69, as before, by way of which it is determined whether additional diagonal block entries of matrix B remain to be solved. If so (decision 69 is YES), index j is decremented in process 70, and solution and storing processes 66, 68 are performed for the next block column in the manner described above. This process continues until the parity bits for each column in the entirety of matrix B have been resolved (decision 69 is NO). The encoding process is then completed by solving for the remainder of the parity bits in process 56, and the generation of codeword c in process 58.

LDPC Encoder Architecture

It has been discovered, in connection with this invention, that this theory of operation of the generation of a codeword c in this manner can be applied in an extremely efficient encoder architecture. This architecture can be realized either by way of custom hardware, as will be described below, or by way of a corresponding sequence of program instructions executable by conventional programmable logic. In either case, real time encoding of data words can be efficiently performed according to this invention.

Figure 7:
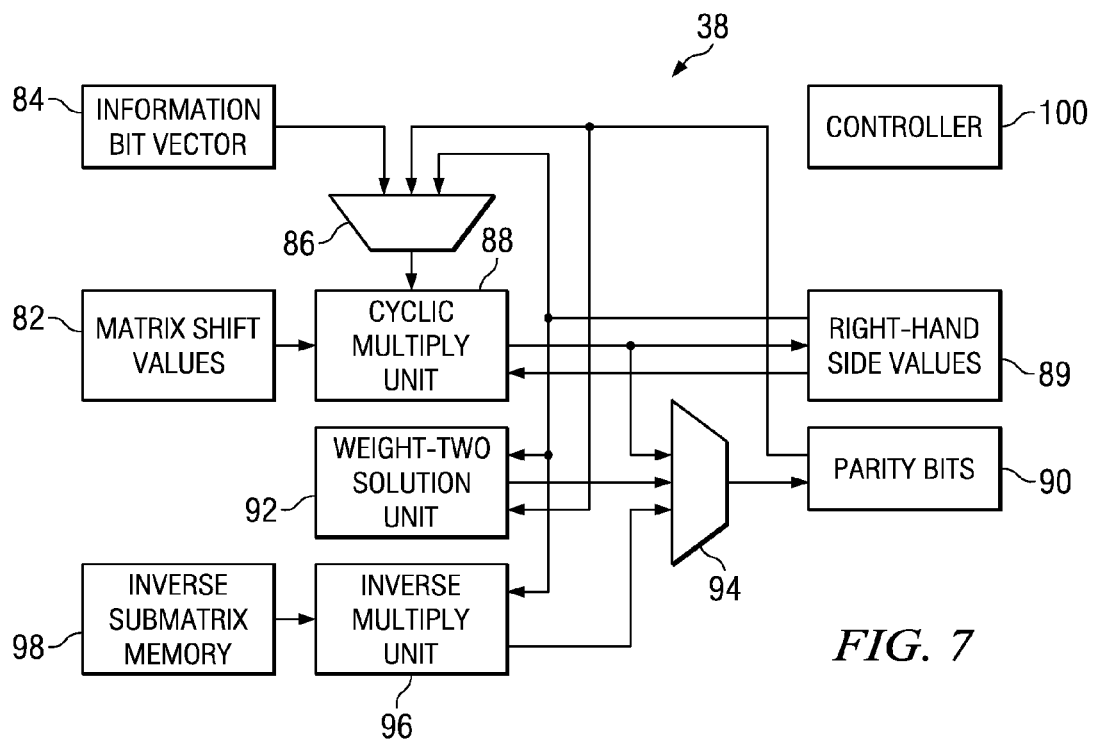
FIG. 7 is an electrical diagram, in block form, of LDPC encoder circuitry in the transceiver of FIG. 2, according to the preferred embodiment of the invention.

FIG. 7 illustrates the construction of LDPC encoder circuitry 38 (FIG. 2) according to the preferred embodiment of the invention. As will become apparent from this description, LDPC encoder circuitry 38 includes circuitry for encoding systematic codewords c both in the case where the parity check matrix can be arranged to have a unique solution, and also in the case where row rank deficiency exists that requires adjustment of the code rate as described above.

LDPC encoder circuitry 38 includes certain memory resources and computational units, all operating under the control of controller 100. Controller 100 is constructed in the conventional manner, for example as a control state machine, control ROM, or in another known arrangement.

On the input side, the memory resources in LDPC encoder circuitry 38 include matrix shift value memory 82, which stores the definition of the various shift values and weights of the overall parity check matrix $H_f$. As described above, these values include the number of cyclically shifted diagonals within each block entry of parity check matrix $H_f$ and also the shift positions of those diagonals within that block entry. As such, the contents of memory 82 completely specifies parity check matrix $H_f$. Another input memory resource in LDPC encoder circuitry 38 is information bit vector memory 84, which receives and stores information portion $c_i$ of the codeword to be encoded. Inverse submatrix memory 98 stores precalculated matrix values for submatrix $B_j$, for use in the event that parity check matrix $H_f$ has a row rank deficiency, as mentioned above, and if the weight of this last submatrix $B_j$ is greater than two.

Output and working memory resources in LDPC encoder circuitry 38 include right-hand side value memory 89, which stores the results of matrix multiplications between the information bit vector stored in memory 84 and the entries in parity check matrix $H_f$ (generated in process 46 and elsewhere), and as will be described below. Parity bit memory 90 stores the resulting parity portion $c_p$ from the encoding process carried out by LDPC encoder circuitry 38.

The computational resources in LDPC encoder circuitry 38 include cyclic multiply unit 88, which effects many of the calculations involved in the encoding process, as will be described below. Inverse multiply unit 96 is a conventional multiplier unit for performing matrix multiplication in the solution involving submatrix $B_j$ in the event that parity check matrix $H_f$ has a row rank deficiency and that the weight of this last submatrix $B_j$ is greater than two. LDPC encoder circuitry 38 also includes weight-two solution 92, which can be used if parity check matrix $H_f$ has a row rank deficiency but the weight of last submatrix $B_j$ is two. The construction of each of these computational resources will be described in further detail below.

The interconnection of these memory and computational resources within LDPC encoder circuitry 38 is illustrated in FIG. 7. As shown, matrix shift value memory 82 is connected to cyclic multiply unit 88. Cyclic multiply unit 88 also receives operands from information bit vector memory 84, right-hand side value memory 89, and parity bit memory 90, via multiplexer 86, which is controlled by controller 100 according to the operations being performed. The output of cyclic memory unit is coupled to right-hand side value memory 89, and to parity bit memory 90 via multiplexer 94. Parity bit memory 90 also receives results from weight-two solution 92 and inverse multiply unit 96, also via multiplexer 94. Right-hand side value memory 89 also has its output coupled to weight-two solution unit 92 and to inverse multiply unit 96. Multiplexers 86 and 94 are conventional multiplexer circuits, having a width corresponding to the width of the data words being handled.

Figure 8:
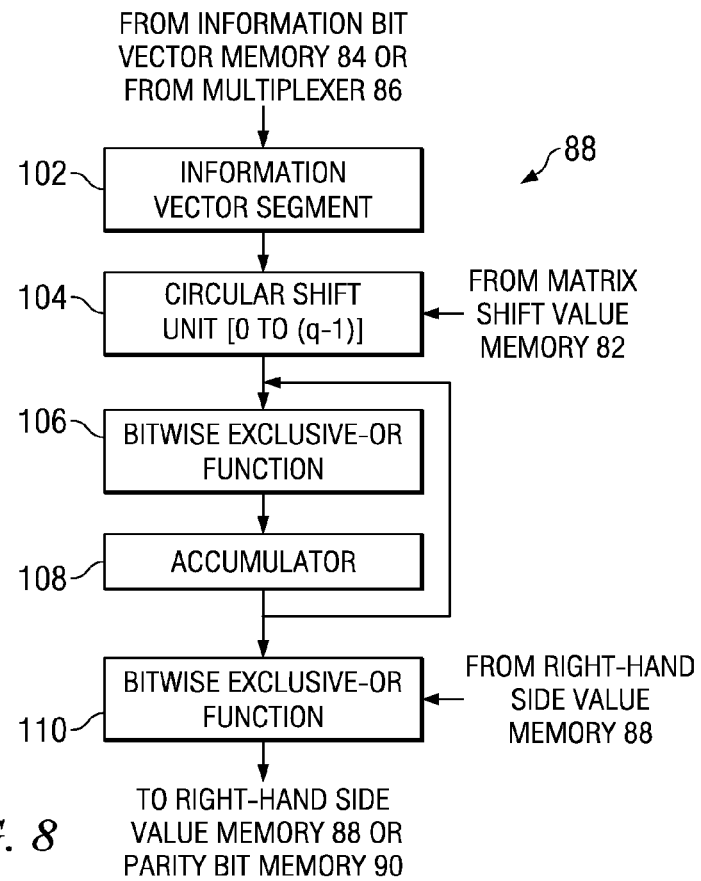
FIG. 8 is an electrical diagram, in block form, of a cyclic multiply unit in the LDPC encoder circuitry of FIG. 7, according to the preferred embodiment of the invention.

Referring now to FIG. 8, the construction of cyclic multiply unit 88 will now be described in detail. This construction will also illustrate the operation of cyclic multiply unit 88 in the encoding process of FIG. 4 described above, and will illustrate the efficiency with which the encoding of LDPC codes is attained according to this preferred embodiment of the invention.

Cyclic multiply unit 88 includes information vector segment register 102, which receives and stores a selected segment of information portion $c_i$ from information bit vector memory 84, or a segment of information from another input source via multiplexer 86. The particular segment stored in register 102 is preferably received and stored by conventional circuitry, under the control of controller 100, and constitutes that portion to be operated upon by cyclic multiply unit 88, depending on the operation. Circular shift unit 104 is a circular, or barrel, shifter, that can receive q bits from register 102, and can shift these bits by a number of bit places from 0 to q−1 responsive to a shift value received from matrix shift value memory 82. The output of circular unit 104 is applied to one input of bitwise exclusive-OR function 106; the output of bitwise exclusive-OR function 106 is applied to the input of accumulator 108, and the output of accumulator 108 is applied as a second input to bitwise exclusive-OR function 106. Bitwise exclusive-OR function 106 is logic for performing an exclusive-OR logic operation, bit-by-bit, on the data words received at its inputs. The output of accumulator 108 is applied to bitwise exclusive-OR function 110, which receives another input from right-hand side value memory 99, and presents its output as the output of cyclic multiply unit 88 to right-hand side value memory 89, or to parity bit memory 90 via multiplexer 94. Bitwise exclusive-OR function 110 thus serves as a modulo-2 accumulator, in which the output of accumulator 108 are subtracted (which, in modulo-2 arithmetic, is effectively an accumulation) from a current right-hand side value from memory 89.

In operation, cyclic multiply unit 88 performs matrix operations useful in the encoding of the LDPC code, according to the processes described above relative to FIG. 4. One such operation is performed by cyclic multiply unit 88 determining the right-hand side values for equations (7) and (11), namely $H_{f,R}c_i$ and $R_jc_i$, and loading these values into right-hand side value memory 89 for use in processes 50 and 56. These right-hand side values are determined using each non-zero block of parity check matrix $H_f$, one block at a time. According to the preferred embodiment of the invention, segment register 102 is loaded with the appropriate segment of information portion $c_i$, and this segment is forwarded to circular shift unit 104. Circular shift unit 104 shifts the received segment by a shift value received from matrix shift value memory 82, for a first one of the cyclically shifted diagonals within the current block of parity check matrix $H_f$. The shifted result is stored in accumulator 108. Circular shift unit 104 then shifts the information segment by a next value, if the weight of the block exceeds one, and this shifted segment is exclusive-ORed with the previous contents of accumulator 108. This process continues, until all diagonals within the current block have been calculated, at which point the contents of accumulator 108 are accumulated into right-hand side value memory 89 by bitwise exclusive-OR function 110, which receives the existing contents of right-hand side value memory 89 at its second input. This operation continues for all blocks of the right-hand side matrix $H_{f,R}$.

In the non-row rank deficient case, cyclic multiply unit 88 is then operated to solve for the parity values associated with the B submatrices, following equation (12) and as described above as process 50. As mentioned above, in this case, the inverse of the B submatrices are applied, but the inverse of a cyclic matrix is itself a cyclic matrix. Accordingly, the shift values for the B submatrices are preferably stored as the shift values for the inverse B submatrices. To then solve for the parity bits associated with a B block, or submatrix, cyclic multiply unit 88 loads a segment from right-hand side value memory 84, via multiplexer 86, into information vector segment register 102. This right-hand value segment is then shifted by circular shift unit 104, by a shift value for the inverse submatrix B received from matrix shift value memory 82, and the shifted result is stored in accumulator 106. For additional diagonals within submatrix B, the right-hand value segment is shifted again by circular shift unit 104, and accumulated with the prior contents of accumulator 108. Upon completion of the block matrix operations for submatrix B, the result in accumulator 106 is forwarded to parity bit memory 90, as the corresponding parity bits $c_p(j)$ for the columns of submatrix B. Once these parity bits are determined, then cyclic multiply unit 88 executes process 52, by computing the upper A and B product values above current submatrix B. In this phase, multiplexer 86 forwards a segment of the recently calculated parity bits $c_p(j)$ for the columns of submatrix B to register 102. These input bits are then accumulated by repeated shifts, based on the matrix shift values from memory 82 for the corresponding blocks, and the result is accumulated with the corresponding block row portion presently in right-hand side value memory 89, using bitwise exclusive-OR function 110. Upon completion of process 52, the right-hand side value memory 89 is now, such that the block column above submatrix B is now part of the "right-hand side" for purposes of equations (7) and (11), and processes 50 and 52 (FIG. 4) can be repeated for the next block column.

Upon all of the parity bits associated with submatrices B being determined (decision 53 of FIG. 4 returning a NO), the parity bits associated with identity block matrix $\tilde{I}$ are determined by cyclic multiply block 88 (process 56 of FIG. 4). In this operation, segment register 102 stores the corresponding right-hand side values from memory 89 for the current block row of identity block matrix $\tilde{I}$, circular shift unit 104 shifts this segment according to the location of the diagonal in this block, as indicated by memory 82, and the results are forwarded through accumulator 108 (only one diagonal being present in this block). The results from accumulator 108 are the corresponding parity bits for this block, and are then stored in parity bit memory 90.

As evident from this description, cyclic multiply unit 88 is relatively simple combinational logic, involving only registers, a shifter, and exclusive-OR functions. This construction takes advantage of the structure of the LDPC code as used in this invention, and provides a low-cost yet computationally efficient LDPC encoder.

As discussed above, if the LDPC code involves row rank deficiency in the parity check matrix, additional complexity due to the lack of a specific solution can result. As also discussed above, through proper pre-implementation arrangement and computation of the parity check matrix, it is contemplated that this deficiency can be addressed within the bottom right submatrix $B_j$ as discussed above. In the case of the weight of this submatrix $B_j$ being two, as described above, and which is contemplated to be likely in many cases, weight-two solution unit 92 of LDPC encoding circuitry 38 can be used to advantage.

Those skilled in the art having reference to this specification will recognize that weight-two solution unit 92 need not be implemented, in which case inverse multiply unit 96 (described below) can be used for all row-rank deficient cases (including the weight-two case), but it is contemplated that the simple logic involved in weight-two solution unit 92, and the avoiding of storing values for a large inverse matrix, both provided according to this embodiment of the invention will provide a beneficial option. Further in the alternative, it is contemplated that all row-rank deficient cases with weight greater than two may be handled simply by detecting this situation and substituting a new LDPC code if such a case is derived, in which case inverse multiply unit 96 would not be implemented.

Figure 9:
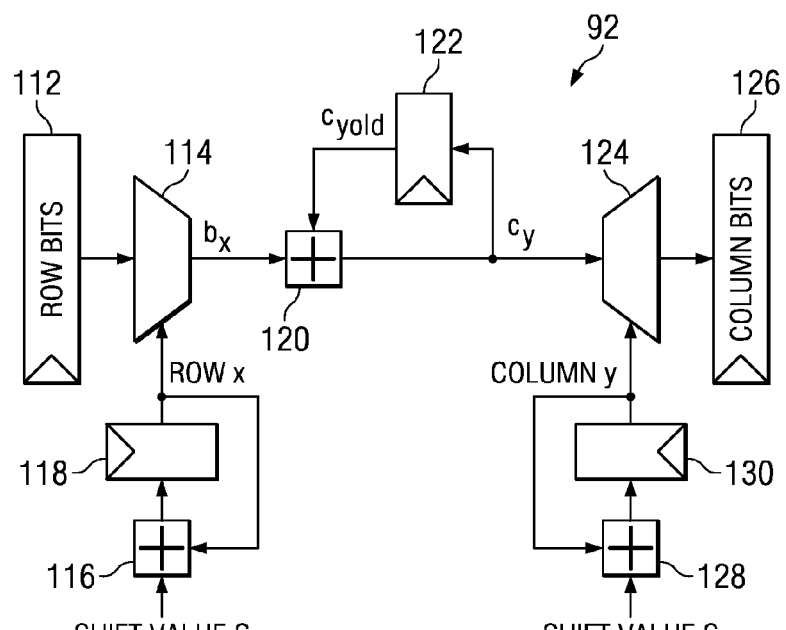
FIG. 9 is an electrical diagram, in schematic and block form, of a weight-two solution unit in the LDPC encoder circuitry of FIG. 7, according to the preferred embodiment of the invention.

FIG. 9 illustrates the construction of weight-two solution unit 92 for performing processes 74, 76 described above, according to the preferred embodiment of this invention. As shown in FIG. 9, register 112 stores the q coefficients of the right-hand side values b corresponding to the last block row, and applies these coefficients to multiplexer 114. The selection by multiplexer 114 is controlled by the output of register 118, which stores the current row index x; this index x is updated by adder 116 in each cycle, which adds shift value s to the current contents of register 118, modulo q. The coefficient $b_x$ selected by multiplexer 114 is applied to modulo-2 adder 120, along with the previous parity bit value $c_{y_{old}}$ that is stored in register 122. The output of modulo-2 adder 120, which is the new parity bit $c_y$, is applied to the input of register 122 and stored there for the next cycle, and is also forwarded to the input of demultiplexer 124. Demultiplexer 124 forwards bit $c_y$ at its input to a location of column bit register 126 in response to the control input from register 130. Register 130 stores the current column index y, which is updated by adder 128 adding shift value s to the prior contents of register 130, modulo q, in each cycle.

In the execution of processes 74, 76, weight-two solution unit 92 begins with register 122 being loaded with the newly assigned information bit $c_{j_{new}}$ (process 72 of FIG. 4), and registers 118, 130 being initialized with the initial row and column indices x1, $y_{q-1}$ as described above. The row bit $b_{x1}$ from register 112 is then summed, modulo 2, with newly assigned information bit $c_{j_{new}}$, and this result is applied to demultiplexer 124. On the next clock cycle, the contents of registers 118, 122, 130 are all updated. This forwards the result bit $c_y$ to the location of column bit register 126 corresponding to the new column index value y (updated contents of register 130). The row bit coefficient $b_x$ selected by the updated value of index x is then applied to adder, along with the updated contents of register 122 from the previous addition, and the process repeats. Controller 100 controls the number of sequences executed by weight-two solution unit 92 to correspond to the size q of submatrix $B_j$, at which point column bit register 136 will contain the parity bits corresponding to submatrix $B_j$.

As evident from this description, the construction and operation of weight-two solution unit 92 is quite simple, and provides excellent efficiency and performance in the resolving of the weight-two row rank deficiency in the LDPC code, should such occur. The largest circuitry required in weight-two solution unit 92 are the q bit multiplexer 114 and q bit demultiplexer 124; all other circuit functions are relatively simple circuits.

Figure 10:
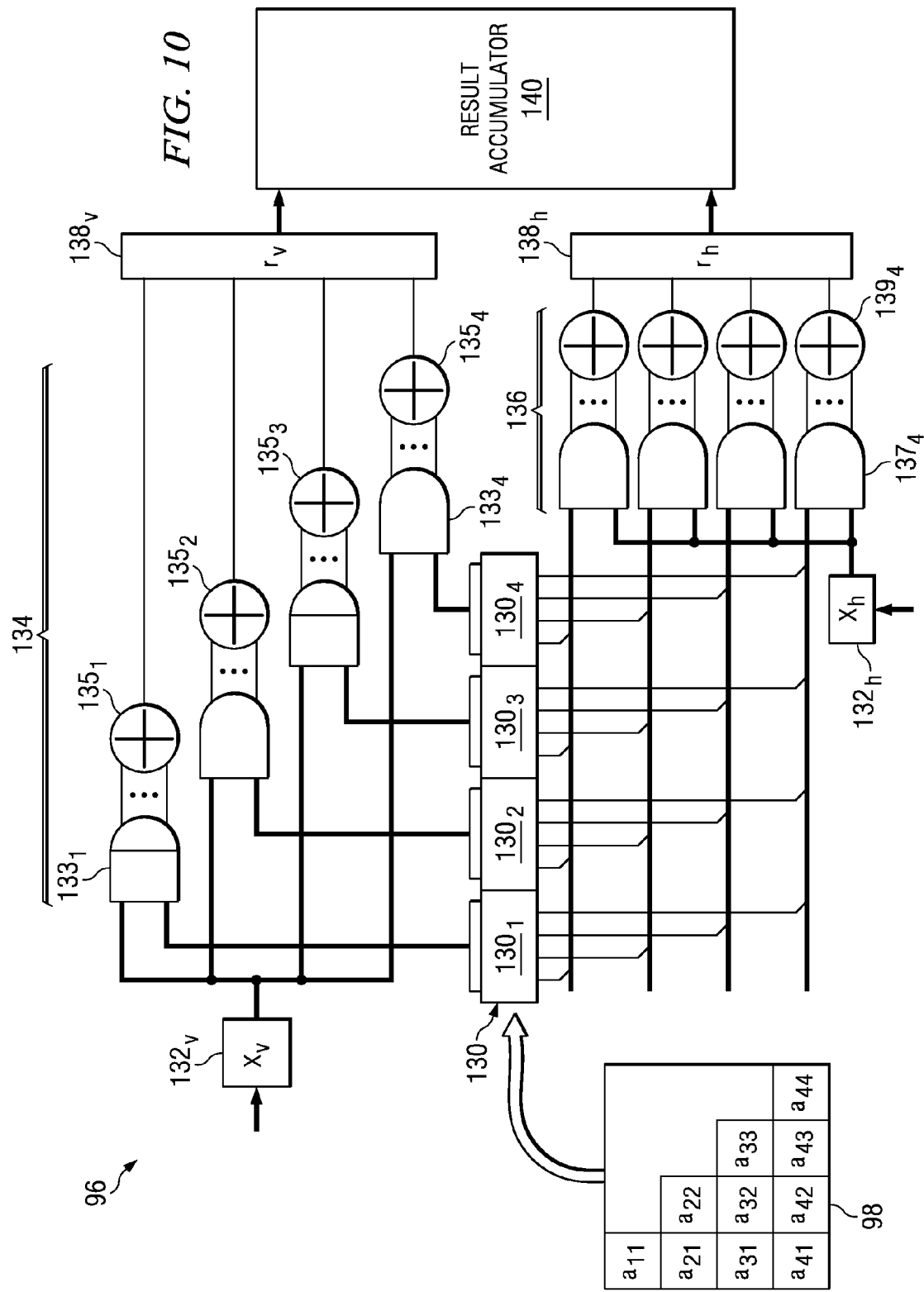
FIG. 10 is an electrical diagram, in block form, of an inverse multiply unit the LDPC encoder circuitry of FIG. 7, according to the preferred embodiment of the invention.

Referring now to FIG. 10, the construction and operation of inverse multiply unit 96, in combination with inverse submatrix memory 98, will now be described. As discussed above, inverse multiply unit 96 can be used to resolve the bottom-right-most submatrix $B_j$ if parity check matrix $H^e_f$ has a row rank deficiency, and is preferably used for those cases in which the bottom-right-most submatrix $B_j$ has a weight greater than two. As mentioned above, in this case, the inverse matrix for bottom-right-most submatrix $B_j$ is preferably calculated in a pre-implementation step (process 67 of FIG. 4), and the entries for this inverse matrix stored in memory, such as inverse submatrix memory 98. Conventional circuitry or program instructions for multiplying the inverse by the right-hand side values can then be used to recover the parity bits $c_p(j)$ for submatrix $B_j$.

It has been further discovered, in connection with this invention, that symmetry properties of the inverse submatrix $B_j$ can provide important efficiency in the amount of memory required in inverse submatrix memory 98, and can also lead to an efficient construction for inverse multiply unit 96. These properties are embodied into the construction of inverse multiply unit 96 and inverse submatrix memory 98 shown in FIG. 10.

Inverse submatrix memory 98, is arranged as a group of blocks, where each block corresponds to a memory word that is row-wise organized. These blocks are illustrated in FIG. 10 as blocks $a_{11}$ through $a_{44}$, and can be considered as a lower triangular matrix; the entries above the diagonal are zero-valued. If the total number of rows and columns covered by this block partitioning is larger than the dimensions of this block matrix a, the extra rows and columns can also be considered as zero-valued, and will not affect the calculations. Each block $a_{ij}$ in inverse submatrix memory 98 has t rows by t columns, and as such corresponds to a memory word of size $t^2$. The arrangement of the inverse submatrix in memory 98 will become apparent from the following description of the operation of inverse multiplier unit 96. While the number of blocks in a row or column of block matrix a in this example equals the number t of rows and columns within each block (i.e., four), this correspondence is simply arbitrary in this example; the particular dimensions of block matrix a and the particular value for number t may be selected by the designer for optimum efficiency.

In solving equation (12) in encoding process 66 (FIG. 4), the inverse matrix stored in inverse submatrix memory 98 will be multiplied by a vector x (retrieved from right-hand side value memory 89), to produce a result vector $c_p$. According to this preferred embodiment of the invention, utilizing the property that the inverse matrix is symmetric about the diagonal, both the "forward" and "transpose" values of the inverse submatrix stored in memory 98 are simultaneously applied against corresponding portions of the multiplier vector x.

Inverse multiply unit 96 includes t memory locations 130, each for storing a column of one of the blocks $a_{ij}$ retrieved from memory 98. While memory locations 130 are illustrated in FIG. 10 as separate registers or stores, memory locations 130 may alternatively represent locations of inverse submatrix memory 98 itself, in which case the contents of memory 98 are bussed directly to logic 134, 136 within inverse multiply unit 96. In either case, for example, if block $a_{11}$ is retrieved from memory 98, and for the case where t=4 (as shown in FIG. 10), memory location $130_1$ will store a first row of block $a_{11}$ in memory location $130_1$, a second row of block $a_{11}$ in memory location $130_2$, a third row of block $a_{11}$ in memory location $130_3$, and a fourth row of block $a_{11}$ in memory location $130_4$. In this case, with t=4, four values are stored in each of the four memory locations 130. Two vector x components $x_v$, $x_h$ are stored in registers 132$v$, 132$h$, respectively, and are to be multiplied by the column and row arrangements of block $a_{11}$ in this example. Registers 132 also may not be physical registers, but may alternatively refer to the bussing of values to logic 134, 136 of inverse multiply unit 96. The four entries in memory location $130_1$ are applied to bitwise AND gate $133_1$, as are the respective contents of register 132$v$; the output of bitwise AND gate $133_1$, is applied to multi-input exclusive-OR gate $135_1$, which performs an exclusive-OR function on the bit-wise AND result from AND gate $133_1$. Similarly, memory locations $130_2$ through $130_4$ are applied to corresponding bit-wise AND gates $133_2$ through $133_4$, which receive corresponding portions of the contents of register 132$v$. The outputs of the exclusive-OR gates 135 are stored in result register 138$v$. In this manner, logic 134 (AND gates 133 and exclusive-OR gates 135) effects a multiplication of block $a_{11}$ with its corresponding vector component $x_v$.

The transpose of the stored contents of memory locations $130_1$ are retrieved in a transposed order, for multiplication by vector component $x_h$, which is stored in register 132$h$. In this example, the first value of each of memory locations $130_1$ through $130_4$ are forwarded to bit-wise AND gate $137_1$, the second value of each of memory locations $130_1$ through $130_4$ are forwarded to bit-wise AND gate $137_2$, the third value of each of memory locations $130_1$ through $130_4$ are forwarded to bit-wise AND gate $137_3$, and the fourth value of each of memory locations $130_1$ through $130_4$ are forwarded to bit-wise AND gate $137_4$. AND gates 137 all also receive corresponding portions of vector component $x_h$ from register 132$h$. Each of AND gates 137 have their outputs applied to a corresponding multi-input exclusive-OR function 139, the output of which is applied to result register 138$h$. In this manner, logic 136 (AND gates 137 and exclusive-OR gates 139) effects a multiplication of the transpose of block $a_{11}$ with its corresponding vector component $x_h$.

Each of result registers 138$v$, 138$h$ have outputs coupled to result accumulator 140, which accumulates the results of the multiplications performed by logic 134, 136, and generate the ultimate result vector $c_p$.

Preferably, the sequence of operations of inverse multiply unit 96 corresponds to the construction of the inverse matrix as stored in memory 98. For the example of t=4, the sequence of multiplications would preferably follow this table:

| Matrix block | $x_v$ | $r_v$ | $x_h$ | $r_h$ |
|---|---|---|---|---|
| $a_{11}$ | $x_1$ | $r_1$ | $x_1$ | $r_1$ |
| $a_{21}$ | $x_1$ | $r_2$ | $x_2$ | $r_1$ |
| $a_{31}$ | $x_1$ | $r_3$ | $x_3$ | $r_1$ |
| $a_{11}$ | $x_1$ | $r_4$ | $x_4$ | $r_1$ |

-continued

| Matrix block | $x_v$ | $r_v$ | $x_h$ | $r_h$ |
|---|---|---|---|---|
| $a_{22}$ | $x_2$ | $r_2$ | $x_2$ | $r_2$ |
| $a_{32}$ | $x_2$ | $r_3$ | $x_3$ | $r_2$ |
| $a_{42}$ | $x_2$ | $r_4$ | $x_4$ | $r_2$ |
| $a_{33}$ | $x_3$ | $r_3$ | $x_3$ | $r_3$ |
| $a_{41}$ | $x_3$ | $r_4$ | $x_4$ | $r_3$ |
| $a_{44}$ | $x_4$ | $r_4$ | $x_4$ | $r_4$ | where the subscript indices within each column of this table refer to partitions of the vector in the corresponding registers. This table illustrates the transpose multiplication effected by inverse multiply unit 96 according to this embodiment of the invention. Further, result accumulator 140 will accumulate the $r_1$ results together, the $r_2$ results together, and so on, by adding each new result segment to data previously placed in that same segment position in the result. An additional accumulation, combining result components $r_v$, $r_h$ is also preferably performed in result accumulator 140.

It is contemplated that this construction of inverse multiply unit 96, together with the memory savings attained by taking advantage of the inverse matrix symmetry, provides additional advantages in the encoding process. In addition, it is contemplated that this construction further widens the acceptable universe of LDPC codes that may be efficiently encoded in real time by LDPC encoding circuitry 38.

According to the preferred embodiment of the invention, therefore, an LDPC encoder architecture is derived that takes advantage of particularly constraints and structure in the LDPC code itself, particularly where that underlying code is realizable in a block matrix form, each block in the block macro matrix corresponding to a cyclically shifted identity matrix, of reasonably low weight. Such codes have been discovered, according to this invention, to lend themselves to efficient encoding, either by custom hardware or by programmable logic executing a relatively simple sequence of instructions. These efficiencies are gained in part by the pre-implementation arrangement of the parity check matrix, and are perfected by the ability to solve for the parity portion of the code word by a sequence of circular shift and accumulate operations. As a result, the benefits of LDPC coding, not the least of which is the efficient application of a code that approaches its Shannon limit, can be obtained through this preferred embodiment of the invention in a manner that is elegant, efficient, and that requires low circuit cost to implement.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An encoder for generating a code word according to a low-density parity check code, comprising:
a matrix value memory for storing shift and weight parameters associated with each of a plurality of macro matrix entries;
a register for storing at least a portion of an information bit vector; and
a cyclic multiply unit, coupled to the matrix value memory and to the register, and comprising:
a shifter for circularly shifting a selected portion of the information bit vector;
a first accumulator, for storing a result value; and
an exclusive-OR function, coupled to the shifter and to the accumulator, for performing a bitwise exclusive-OR operation on the output of the shifter and the output of the first accumulator; and
a right-hand side value memory, coupled to the cyclic multiply unit, for storing product values.

2. The encoder of claim 1, further comprising:
a parity memory, coupled to the cyclic multiply unit, for storing parity bits for the code word.

3. The encoder of claim 1, wherein the cyclic multiply unit further comprises:
a second accumulator, having a first input coupled to the right-hand side value memory and a second input coupled to the output of the first accumulator, for updating the contents of the right-hand side value with the contents of the first accumulator.

4. The encoder of claim 1, further comprising:
a controller, for controlling the encoder responsive to a sequence of program instructions.

5. The encoder of claim 1, further comprising:
a parity memory, coupled to the cyclic multiply unit, for storing parity bits for the code word; and
an input multiplexer, having inputs coupled to the register, to the right-hand side value memory, and to the parity memory, for applying a selected value to the shifter of the cyclic multiply unit.

6. The encoder of claim 1, further comprising:
an inverse submatrix memory, for storing parameters corresponding to an inverse of a submatrix; and
an inverse multiply unit, for multiplying product values by parameters stored in the inverse submatrix memory.

7. The encoder of claim 6, wherein the inverse submatrix memory is for storing a sequence of parameters for entries of the inverse of the sub matrix;
and wherein the inverse multiply unit comprises:
a first register for storing a first portion of a product value;
a second register for storing a second portion of the product value;
a first logic circuit for combining the sequence of parameters with the first portion of the product value; and
a second logic circuit for combining the sequence of parameters, in a transposed sequence relative to that combined by the first logic circuit, with the second portion of the product value.

8. The encoder of claim 7, wherein the inverse multiply unit further comprises:
a result accumulator for accumulating results generated by the first and second logic circuits.

9. The encoder of claim 7, wherein the parameters stored in the inverse submatrix memory correspond to parameters along the diagonal and on one side of the diagonal of the submatrix.

10. The encoder of claim 1, further comprising:
a parity memory, coupled to the cyclic multiply unit, for storing parity bits for the code word; and
a weight-two solution unit, having an input for receiving values from the right-hand side value memory, and having an output coupled to the parity memory, for successively solving parity bit values in a submatrix having a weight of two.

11. The encoder of claim 10, wherein the weight-two solution unit comprises:
a register for storing values from the right-hand side value memory;
a multiplexer, coupled to the register, for selecting one of the bits of the register responsive to a control input;
a row index register, for storing a shifted value and for applying the value to the multiplexer as its control input;
logic circuitry, for generating an exclusive-OR of a prior result value and the bit selected by the multiplexer;
an output register, for storing results from the logic circuitry;
a demultiplexer, for coupling the logic circuitry to a position of the output register responsive to a control input; and
a column index register, for storing a shifted value and for applying the value to the demultiplexer as its control input.

12. A method of encoding code words according to a low-density parity check matrix, comprising the steps of:
storing, in a memory, parameters for each of a plurality of non-zero entries of a parity check matrix, the parameters for each entry comprising a weight value indicating the number of shifted diagonals contained within that entry, and shift values indicating the position of the shifted diagonals;
receiving an information word;
multiplying the information word by a portion of the parameters of the parity check matrix;
storing the results of the multiplying step in a right-hand side value memory;
for one or more submatrices, successively solving a plurality of parity bits using results from the right-hand side value memory and stored parameters of the submatrix in the memory;
then updating the contents of the right-hand side value memory for columns corresponding to the plurality of parity bits;
for a remaining identity portion of the parity check matrix, determining corresponding parity bits from the stored right-hand side values.

13. The method of claim 12, wherein the successively solving step and the updating step are repeated for a plurality of submatrices.

14. The method of claim 12, further comprising:
prior to the step of storing parameters for each of a plurality of non-zero entries of a parity check matrix, selecting a low-density parity check code;
factoring a parity check matrix corresponding to the selected code so that a left-hand portion comprises an identity portion above a zero portion, and at least one submatrix in a lower-right portion of the left-hand portion;
storing weight values and shift values for each of the entries of the rearranged parity check matrix.

15. The method of claim 12, wherein the at least one submatrix comprises a diagonal submatrix with each entry on the diagonal being a small odd integer.

16. The method of claim 12, wherein the at least one submatrix comprises an upper triangular matrix in which the diagonal entries are small odd integers.

17. The method of claim 12, wherein the multiplying step comprises:
shifting a portion of the information word by a shift value corresponding to an entry of the parity check matrix;
performing a bitwise exclusive-OR of the shifted portion of the information word with a prior accumulated value;
storing the results of the step of the bitwise exclusive-OR as the accumulated value;
repeating the shifting, performing, and storing steps according to a weight value for the entry of the parity check matrix.

18. The method of claim 17, wherein the multiplying step further comprises:
accumulating the last result of the repeated steps with selected stored right-hand side values.

19. The method of claim 12, wherein the successively solving step comprises:
shifting a portion of selected contents of the right-hand side value memory by a shift value corresponding to an entry of the parity check matrix;
performing a bitwise exclusive-OR of the shifted portion of the contents of the right-hand side value memory with a prior accumulated value;
storing the results of the step of the bitwise exclusive-OR as the accumulated value; and
repeating the shifting, performing, and storing steps according to a weight value for the entry of the parity check matrix.

20. The method of claim 12, wherein the step of determining corresponding parity bits from the stored right-hand side values comprises performing cyclically shifting selected stored right-hand side values.

21. The method of claim 12, further comprising:
detecting a last submatrix as having row rank deficiency; and
responsive to the detecting step, solving a plurality of parity bits using an inverse of the last submatrix.

22. The method of claim 12, further comprising:
detecting a last submatrix as having row rank deficiency and a weight of two; and
changing a parity bit position to a new information bit position;
then solving a plurality of parity bits corresponding to the last submatrix by successively applying a solved bit, beginning with a bit in the new information bit position, to equations corresponding to the last submatrix.

23. The method of claim 12, wherein the updating step comprises:
shifting a portion of selected contents of the right-hand side value memory by a shift value corresponding to an entry of the parity check matrix;
performing a bitwise exclusive-OR of the shifted portion of the selected contents of the right-hand side value memory with a prior accumulated value;
storing the results of the step of the bitwise exclusive-OR as the accumulated value;
repeating the shifting, performing, and storing steps according to a weight value for the entry of the parity check matrix;
then accumulating the accumulated value with the selected contents of the right-hand side value memory.

24. A transceiver for communicating encoded signals, comprising:
an encoder for encoding code words according to a low-density parity-check code, comprising:
a matrix value memory for storing shift and weight parameters associated with each of a plurality of macro matrix entries;
a register for storing at least a portion of an information bit vector; and a cyclic multiply unit, coupled to the matrix value memory and to the register, and comprising:
a shifter for circularly shifting a selected portion of the information bit vector;
a first accumulator, for storing a result value; and
an exclusive-OR function, coupled to the shifter and to the accumulator, for performing a bitwise exclusive-OR operation on the output of the shifter and the output of the first accumulator; and
a right-hand side value memory, coupled to the cyclic multiply unit, for storing product values; and
a modulator, for modulating signals corresponding to the code words;
digital-to-analog converter circuitry, for generating an analog signal corresponding to the modulated signals; and
transmitter circuitry, for transmitting the analog signal over a communications facility.

25. The transceiver of claim 24, wherein the encoder further comprises:
a parity memory, coupled to the cyclic multiply unit, for storing parity bits for the code word.

26. The transceiver of claim 24, further comprising:
receiver circuitry, for receiving analog signals;
demodulator circuitry, for demodulating the received analog signals into code words; and
decoder circuitry, for decoding the code words to recover information words therefrom.

27. The transceiver of claim 24, wherein the encoder further comprises:
an inverse submatrix memory, for storing parameters corresponding to an inverse of a submatrix; and
an inverse multiply unit, for multiplying product values by parameters stored in the inverse submatrix memory.

28. The transceiver of claim 27, wherein the inverse submatrix memory is for storing a sequence of parameters for entries of the inverse of the sub matrix;
and wherein the inverse multiply unit comprises:
a first register for storing a first portion of a product value;
a second register for storing a second portion of the product value;
a first logic circuit for combining the sequence of parameters with the first portion of the product value; and
a second logic circuit for combining the sequence of parameters, in a transposed sequence relative to that combined by the first logic circuit, with the second portion of the product value.

29. The transceiver of claim 28, wherein the parameters stored in the inverse submatrix memory correspond to parameters along the diagonal and on one side of the diagonal of the submatrix.

30. The transceiver of claim 24, wherein the encoder further comprises:
a parity memory, coupled to the cyclic multiply unit, for storing parity bits for the code word; and
a weight-two solution unit, having an input for receiving values from the right-hand side value memory, and having an output coupled to the parity memory, for successively solving parity bit values in a submatrix having a weight of two.

31. The transceiver of claim 30, wherein the weight-two solution unit comprises:
a register for storing an indication of entries in the submatrix;
a multiplexer, coupled to the register, for selecting one of the bits of the register responsive to a control input;
a row index register, for storing a shifted value and for applying the value to the multiplexer as its control input;
logic circuitry, for generating an exclusive-OR of a prior result value and the bit selected by the multiplexer;
an output register, for storing results from the logic circuitry;
a demultiplexer, for coupling the logic circuitry to a position of the output register responsive to a control input; and
a column index register, for storing a shifted value and for applying the value to the demultiplexer as its control input.

32. A cyclic multiply unit, comprising:
a shifter for circularly shifting a selected portion of a vector;
a first accumulator, for storing a result value;
an exclusive-OR function, coupled to the shifter and to the accumulator, for performing a bitwise exclusive-OR operation on the output of the shifter and the output of the first accumulator; and
a second accumulator, having a first input for receiving a stored value, and a second input coupled to the output of the first accumulator, for updating the stored value with the contents of the first accumulator, wherein the second accumulator comprises a bitwise exclusive-OR function.

* * * * *